(12) United States Patent
Nakata

(10) Patent No.: US 6,215,321 B1
(45) Date of Patent: Apr. 10, 2001

(54) PROBE CARD FOR WAFER-LEVEL MEASUREMENT, MULTILAYER CERAMIC WIRING BOARD, AND FABRICATING METHODS THEREFOR

(75) Inventor: Yoshiro Nakata, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/198,445

(22) Filed: Nov. 24, 1998

(30) Foreign Application Priority Data

Nov. 25, 1997 (JP) .................................................. 9-323031

(51) Int. Cl.⁷ .................................................. G01R 31/02
(52) U.S. Cl. ...................................... 324/754; 428/209
(58) Field of Search .................................. 324/754, 755, 324/73.1, 158.1, 765, 762; 428/210, 209, 901

(56) References Cited

U.S. PATENT DOCUMENTS

| | | | |
|---|---|---|---|
| 4,624,896 | * 11/1986 | Watanabe et al. | 428/428 |
| 4,795,670 | * 1/1989 | Nishigaki et al. | 428/209 |
| 4,912,399 | * 3/1990 | Greub et al. | 324/754 |
| 5,665,459 | * 9/1997 | Fukuta et al. | 428/209 |
| 5,701,085 | * 12/1997 | Malladi et al. | 324/754 |

FOREIGN PATENT DOCUMENTS 7-231019   8/1995  (JP) .

OTHER PUBLICATIONS

Y. Nakata et al., "A Wafer–Level Burn–in Technology Using the Contactor Controlled Thermal Expansion", Proc. of 1997 International Conference and Exhibition on Multichip Models, pp. 259–264, Apr. 1997.

* cited by examiner

Primary Examiner—Safet Metjahic
Assistant Examiner—Minh Tang
(74) Attorney, Agent, or Firm—Eric J. Robinson; Nixon Peabody LLP

(57) ABSTRACT

A probe card for wafer-level measurement comprises a plurality of bump electrodes arranged in two dimensions and a multilayer wiring board electrically connected to the bump electrodes. The multilayer wiring board has a multilayer ceramic board and a thin-film wiring layer formed by a lithographic technique. The thin-film wiring layer comprises a plurality of pads, each of which include: a via contact region for contact with a via electrode at the surface of the multilayer ceramic board; a bump contact region for contact with at least one of the probe electrode; and a lead region for providing a connection between the via contact region and the bump contact region.

4 Claims, 7 Drawing Sheets

PROBE CARD FOR WAFER-LEVEL MEASUREMENT, MULTILAYER CERAMIC WIRING BOARD, AND FABRICATING METHODS THEREFOR

BACKGROUND OF THE INVENTION

The present invention relates to a probe card for wafer-level measurement, a multilayer ceramic wiring board, and fabricating methods therefor.

With recent remarkable advances in the size and cost reductions of electronic equipment provided with a semiconductor integrated circuit device, size and cost reductions have also been required of the semiconductor device mounted thereon.

In the process of fabricating a semiconductor device, an electric interconnection is normally provided between a semiconductor chip and a leadframe by bonding wires. The semiconductor chip and the leadframe are then sealed with a resin or ceramic package to be mounted on a printed circuit board. To meet the demand for miniaturization, there has been developed a method of mounting a bare chip directly on a circuit board. Therefore, it is necessary to test the bare chip prior to be mounted on the circuit board.

For the quality assurance of bare chips, it is necessary to perform a burn-in or like test of the bare chips. However, it required considerable time to perform separate testing of a plurality of bare chips over several times by inspecting one or more chips at a time. Accordingly, it is preferable that all the bare chips on a semiconductor wafer are test simultaneously.

To conduct a wafer-level test on the bard chips, it is required to simultaneously drive the plurality of semiconductor devices formed in the semiconductor wafer by applying a power-source voltage or signals to electrodes of the semiconductor chips at a time. To meet the requirement, a probe card having numerous probe needles (normally several tens of probe needles or more) is needed. However, a conventional probe card with needles is unsatisfactory in both the number of pins and cost.

To overcome the disadvantage of the conventional probe card, there has been proposed a probe card with probe electrodes that can be brought into simultaneous contact with a large number of pad electrodes on a wafer (see Japanese Unexamined Patent Publication No. 7-231019). According to the technology disclosed in the publication, a large number of bumps are formed in the probe card and used as the probe electrodes.

The probe card needs a multilayer wiring board for supplying a power-source voltage and an electric signal to each of the bumps. The multilayer wiring board is manufactured by forming multilevel wiring layers on a glass substrate.

To insulate such multilevel wiring layers, an interlevel dielectric film is formed by applying a polyimide thin film or the like to the surface of the glass substrate. However, the thickness of the polyimide thin film is at most in the range of 5 to 10 $\mu$m because of limitations to the fabricating method. Since capacitance coupling occurred between the individual wiring layers insulated by the interlevel dielectric film having a thickness in the range, a high-frequency signal cannot be used for wafer-level measurement.

It is therefore an object of the present invention, which has been achieved in view of the foregoing, to provide a probe card which enables wafer-level measurement using a high-frequency signal, a multilayer ceramic wiring board suitable for use in the probe card, and fabricating methods therefor.

SUMMARY OF THE INVENTION

In one aspect of the present invention, a probe card for wafer-level measurement comprises: a plurality of probe electrodes arranged in two dimensions; and a multilayer wiring board electrically connected to the probe electrodes, the multilayer wiring board having a multilayer ceramic board and at least one thin-film wiring layer formed on at least one surface of the multilayer ceramic board, the thin-film wiring layer comprising a plurality of pads, each of the pads including: a via contact region connected with a via electrode at the surface of the multilayer ceramic board; a probe contact region for contact with at least one of the probe electrode; and a lead region for providing a connection between the via contact region and the probe contact region.

In still another aspect of the present invention, a multilayer ceramic wiring board comprises: a multilayer ceramic board; and at least one thin-film wiring layer formed on at least one surface of the multilayer ceramic board, the thin-film wiring layer comprising a plurality of pads, each of the pads including: a via contact region connected with a via electrode at the surface of the multilayer ceramic board; a probe contact region for contact with at least one of electrodes of an electronic device; and a lead region for providing a connection between the via contact region and the probe contact region.

In another aspect of the present invention, a method for fabricating a probe card for wafer-level measurement comprises the steps of: forming a plurality of probe electrodes arranged in two dimensions; forming a multilayer ceramic board having a plurality of via electrodes; forming at least one thin-film wiring layer on at least one surface of the multilayer ceramic board, the thin-film wiring layer comprising a plurality of pads, each of the pads including a via contact region connected with one of the via electrodes at the surface of the multilayer ceramic board, a probe contact region for contact with at least one of the probe electrode, and a lead region for providing a connection between the via contact region and the probe contact region; and connecting the probe electrodes to the pads of the thin-film wiring layer on the multilayer ceramic board.

BRIEF DESCRIPTION OF THE DRAWINGS

FIG. 2 is a cross-sectional view of a probe card according to the present invention and the like;

DESCRIPTION OF THE PREFERRED EMBODIMENTS

Figure 1:
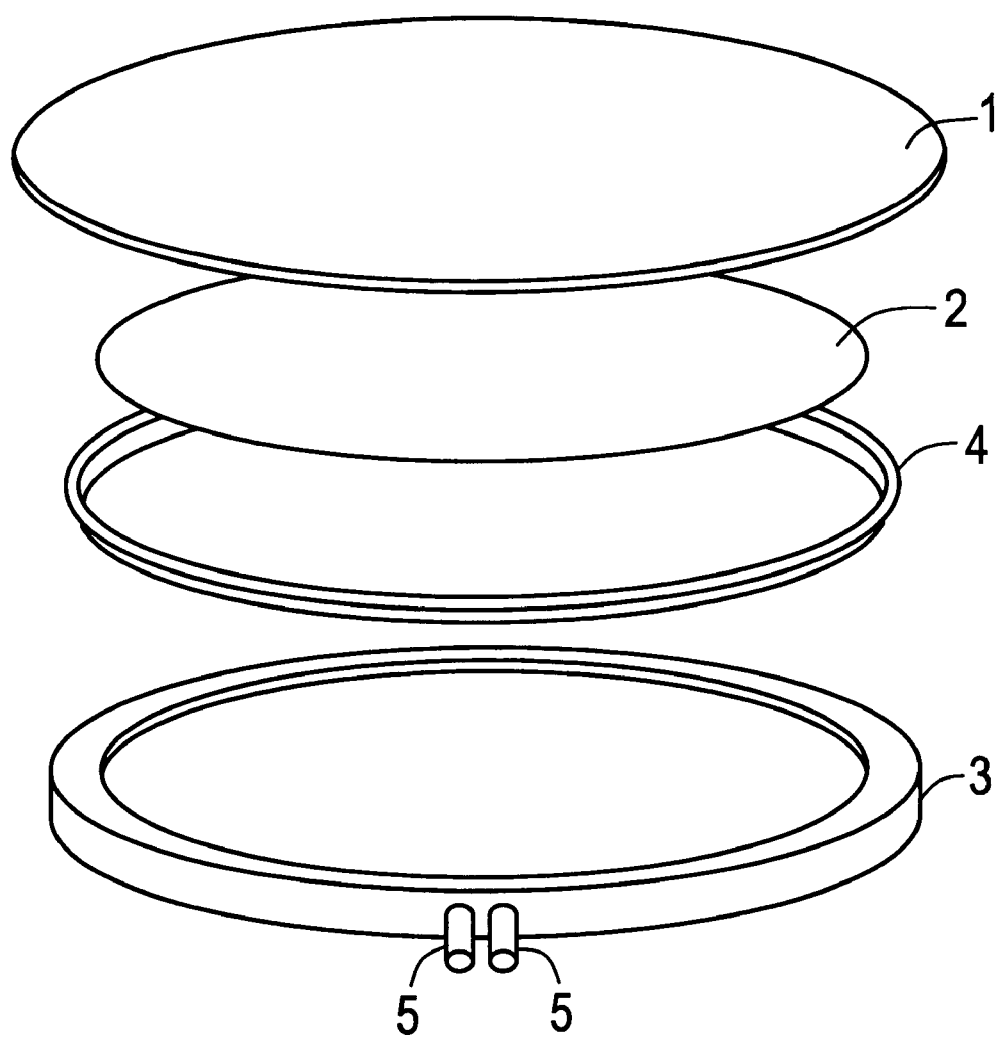
FIG. 1 is a perspective view for illustrating wafer-level measurement technology.

FIG. 1 shows a probe card 1 according to the present invention. The probe card 1 has probe electrodes which are to be brought into simultaneous contacts with a large number of pad electrodes formed on a wafer. In this embodiment, a semiconductor circuit wafer 2 (a silicon wafer with a diameter of, e.g., 200 mm) to be subjected to wafer-level measurement is placed on a wafer tray 3 without being divided into individual chips. Prior to measurement, the wafer 2 is interposed between the probe card 1 and the wafer tray 3. A narrow space formed between the probe card 1 and the wafer tray 3 is sealed from an atmosphere by means of a seal ring 4. When the space is evacuated via a vacuum valve 5 (e.g., to a pressure approximately 200 millimeter lower than atmospheric pressure), the probe card 1 evenly presses the wafer 2 with the aid of atmospheric pressure. This allows the probe electrodes of the probe card 1 to press the corresponding pad electrodes formed over the entire surface of the large wafer 2 with equal pressure. To ensure contacts between the numerous probe electrodes of the probe card 1 and the corresponding pad electrodes on the wafer 2, it is necessary to align the probe card 1 with respect to the wafer with high accuracy.

Such wafer-level measurement technology allows the numerous probe electrodes on the probe card 1 to be brought into simultaneous and positive contacts with the numerous pad electrodes as many as several thousands to several tens of thousands formed over the entire surface of the wafer 2.

Figure 2:
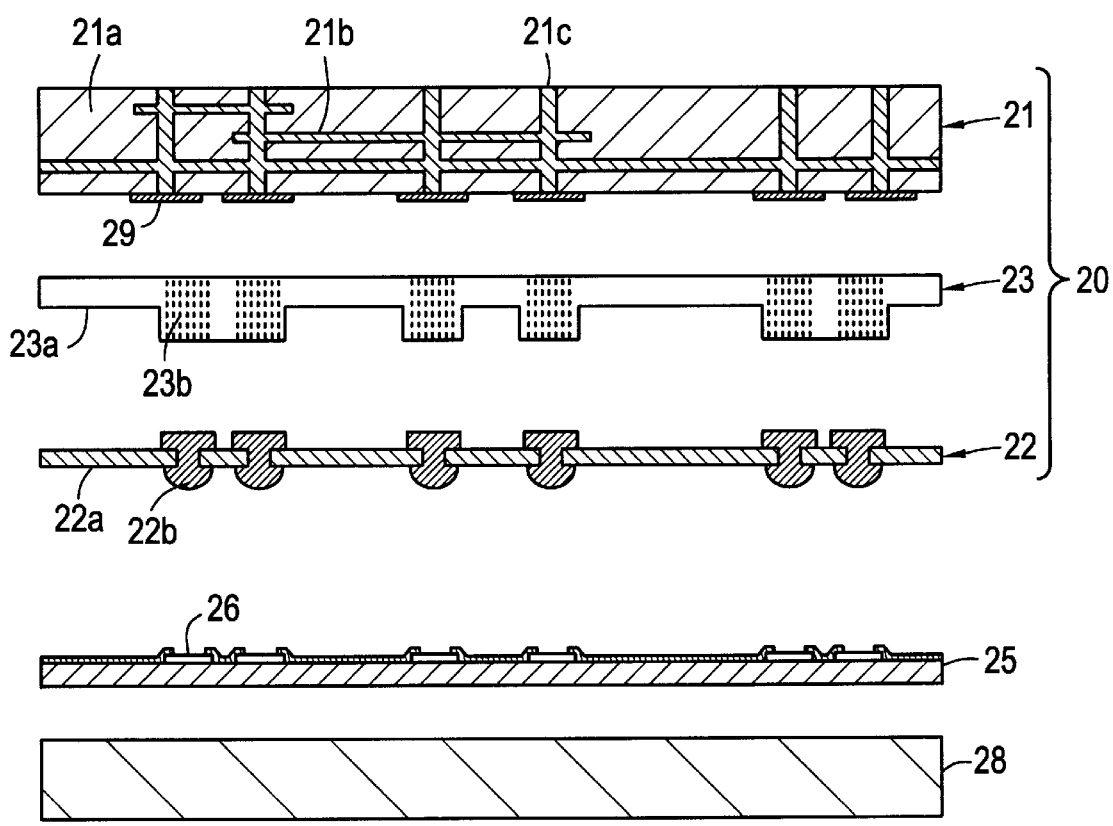

FIG. 2 shows exemplary cross-sectional structures of a probe card 20 according to the present invention and the like.

The probe card 20 comprises: a multilayer wiring board 21 to be electrically connected to a measurement apparatus; a polyimide thin film 22 with bumps; and a localized anisotropic conductive rubber 23 disposed between the multilayer wiring board 21 and the polyimide thin film 22. The localized anisotropic conductive rubber 23 is an elastic member for providing electric connections between a thin-film wiring layer 29 formed on the multilayer wiring board 21 and the bumps 22b of the polyimide thin film 22. Although the foregoing three members 21 to 23 shown in FIG. 2 are separated from each other in the vertical direction, the three members 21 to 23 are joined together to form the single probe card 20.

Multilayer wiring layers 21b and through-hole wiring 21c in the multilayer wiring board 21 are for electrically connecting the numerous bumps (probe electrodes) 22b arranged in two dimensions in a plane to a connecting electrode or connector (not shown) disposed on the peripheral region of the probe card 20. As a result, electric connections is achieved between an external testing apparatus and the probe electrodes 22b. The multilayer wiring board 21 will be described later in greater detail.

The polyimide thin film 22 with bumps are obtained as follows. First, a two-layer base consisting of a polyimide thin film 22a with a thickness on the order of 18 µm and a copper thin film with a thickness on the order of 35 µm is formed with a large number of apertures (each having an inner diameter of 20 to 30 µm). A metal material such as Ni is filled in each of the apertures by an electrolytic plating or like process to form the bumps 22b. The polyimide thin film 22 shown in the drawing is obtained by etching away the unwanted portions of the copper thin film from the polyimide thin film 22a. For example, each of the bumps 22b has a height on the order of about 20 µm and a lateral dimension on the order of 40 µm. The locations of the bumps 22b to be formed in the polyimide thin film 22a are determined by the locations of the pad electrodes 26 formed on the wafer 25 as the target of measurement.

Conductive particles 23b are disposed on the specified portions of a sheet 23a made of silicone rubber (with a thickness on the order of 200 µm), where they are linked to each other in the direction of conduction (along the film thickness) to form chains of particles. The provision of the elastic rubber between the multilayer wiring board 21 and the bumps 22b achieves ensured contacts between the bumps 22b of the probe card 20 and the electrodes 26 on the wafer 25 without being affected by a level difference observed at the top surface of the wafer 25 or the warping of the wafer 25.

In the case of using such a probe card 20 in a wafer-level burn-in test, the bumps 22b in the polyimide thin film 22a are laterally displaced from the pad electrodes 26 on the wafer 25 during heating for a burn-in test because the thermal expansion coefficient of the polyimide thin film 22a (about $16 \times 10^{-6}/°$ C.) is different from that of the wafer 25 (about $3 \times 10^{-6}/°$ C.). The displacement is more conspicuous at the peripheral portion of the wafer 25 than at the central portion thereof, so that normal electric contact is no more achieved between the wafer 25 and the probe card 20. To solve the problem, Japanese Unexamined Patent Publication No. 7-231019 has disclosed an effective method in which a rigid ring (not shown) such as a ceramic ring having a thermal expansion coefficient close to that of the silicon wafer is attached to the polyimide thin film 22a to preliminarily impart tension to the polyimide thin film 22a. In this case, the bumps 22b are preferably formed after the attachment of the polyimide thin film 22a to the rigid ring for preventing the displacement of the bumps 22b.

The wafer 25 is mounted on the wafer tray 28. After the wafer tray 28 with the wafer 25 mounted thereon is properly positioned with respect to the probe card 20, the space between the probe card 20 and the wafer tray 28 is reduced to bring the bumps 22b of the probe card 20 into physical contact with the pad electrodes 26 on the wafer 25. As stated previously, the evacuation of the space sealed between the probe card 20 and the wafer tray 28 allows the individual bumps 22b to press the corresponding pad electrodes 26 on the wafer 25 with equal pressure. Thereafter, electric signals and a power-source voltage from a driving circuit (not shown) and a testing circuit (not shown) are supplied to the pad electrodes 26 on the wafer 25 via the bumps 22 of the probe card 20. In the case of performing a wafer-level burn-in test, the probe card 20, the wafer 25, and the wafer tray 28 are integrally charged into a burn-in system and heated, as shown in FIG. 3.

Figure 3:
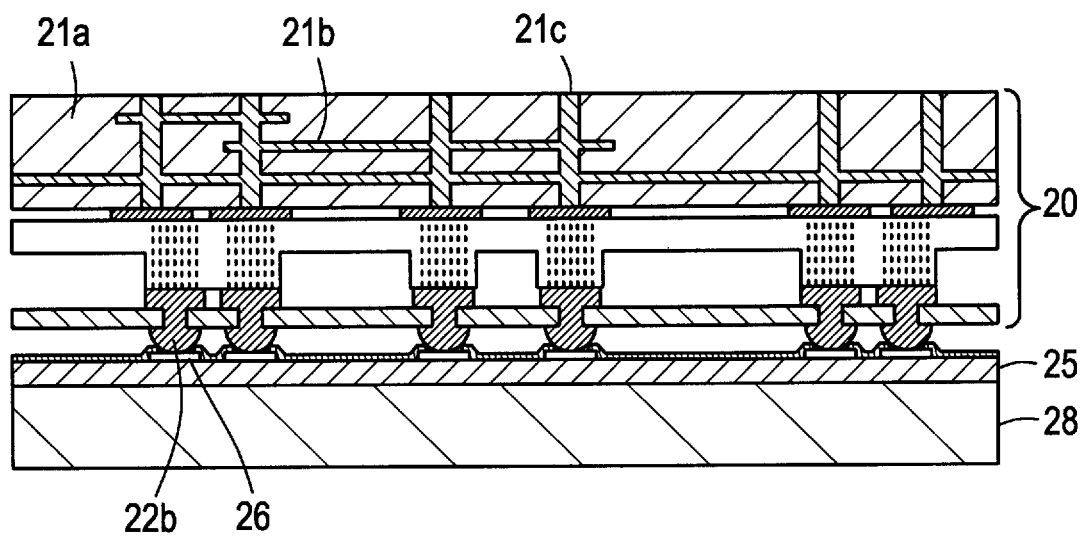
FIG. 3 is a cross-sectional view showing the relations among a probe card, a wafer, and a wafer tray during measurement.

During measurement and the periods prior and subsequent thereto, the probe card 20, the wafer 25, and the wafer tray 28 are held in a state as shown in FIG. 3. The wafer tray 28 with the sealed space in vacuum is prevented from falling out of the probe card 20 so that these members are integrally holding the wafer.

After the wafer-level measurement is completed, the pressure in the sealed space formed between the probe card 20 and the wafer tray 28 is increased and restored to a value equivalent to that of atmospheric pressure. Thereafter the tray 28 is detached from the probe card 20 and the wafer 25 is discharged from inside the wafer tray 28.

Next, a detailed description will be given to the features of the probe card 20 according to the present invention.

The first feature of the probe card 20 according to the present invention is the use of a multilayer ceramic board 21a as the main component of the multilayer wiring board 21. This allows the thickness of an insulating layer positioned between the adjacent multilevel wiring layers 21b to be set to about 100 µm or more, which is ten times as large as or larger than the thickness of a conventional interlevel dielectric film (5 to 10 μm) using a polyimide thin film or the like. What results is a multilayer wiring board with excellent high-frequency characteristics in which only a lower degree of capacitance coupling occurs between the individual wiring layers.

The second feature of the probe card 20 is the formation of the uppermost wiring layer (thin-film wiring layer) 29 of the multilayer wiring board 21 by a thin film process such as a thin-film depositing process or a lithographic process used for the fabrication of an LSI. The following is the reason for using the thin-film process.

In general, a multilayer ceramic board in the fabricating process contracts greatly through sintering. However, it is difficult to precisely estimate and control the degree of contraction. A probe card for wafer-level measurement employs a multilayer wiring board having an area larger than that of the wafer. When the multilayer ceramic board is used as the base of the probe card, the board contracts remarkably at the peripheral portion of the probe card. The contraction displaces wiring electrodes on the multilayer ceramic board (e.g., electrodes and vias to be in contact with the bumps) from predetermined positions (design positions) to an unpredictably great degree. The displacement in turn causes a great displacement between each of the bumps 22b of the thin film 22 and the electrode or via on the multilayer ceramic board to be in contact with the bump 22b, so that it is no more possible to provide an electric contact between the bump 22b and the multilayer wiring board.

Normally, it is impossible to form a large electrode for contact with a bump which has a sufficient margin to compensate for such a displacement. This is because the size of the electrode for contact with a bump should be sufficiently smaller than the pitch of the bumps 22b which are normally arranged with a pitch of 200 μm or less. The future trend is toward a further reduced spacing between the adjacent bumps 22b. Accordingly, the size of the pad electrode disposed on the multilayer wiring board 21 for contact with a bump should further be reduced. However, variations in the degree of contraction of the multilayer ceramic board 21a cannot be accommodated in the size of the electrode for contact with a bump. Therefore, the multilayer ceramic board cannot be used as it is in the probe card for wafer-level measurement without any modifications.

To render the multilayer ceramic board usable, the present invention has used, e.g., the thin-film process in forming the thin-film wiring layer 29 for contact with a bump on the multilayer ceramic board 21a contracted through sintering. The thin-film process, which is to be used for the fabrication of an LSI, allows an extremely fine wiring pattern to be formed at a predetermined position with high accuracy. The wiring layer 29 formed for contact with a bump functions as an interlayer for providing a stable electric connection between the bump 22b and a small electric connecting point (e.g., a via) on the multilayer ceramic board 21a to which high-accuracy position control cannot be performed.

Figure 4A:
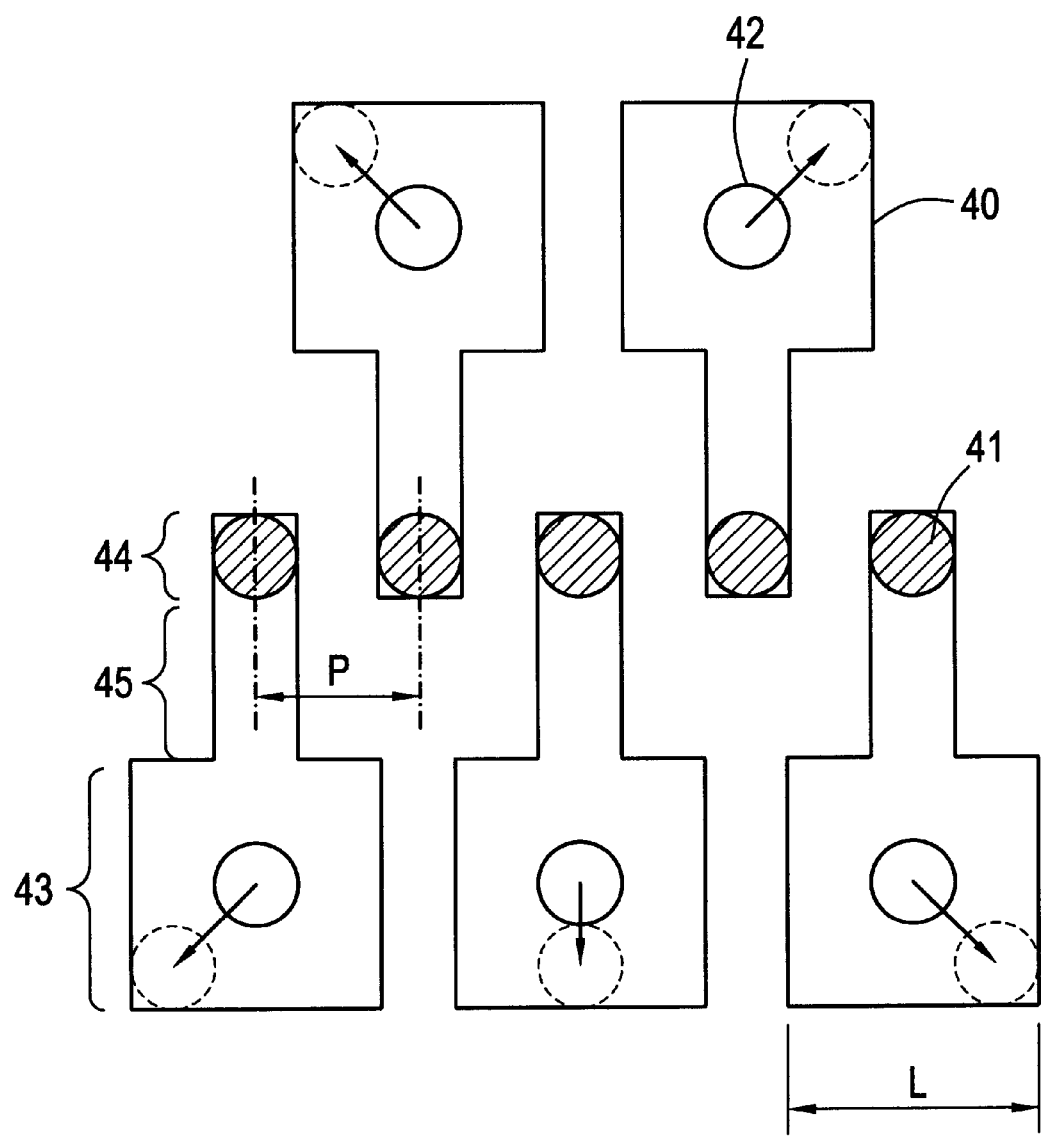
FIG. 4A shows a two-dimensional layout of a thin-film wiring pattern and FIG. 4B shows another two-dimensional layout of the thin-film wring pattern.

FIG. 4A shows an exemplary layout of the patterned thin-film wiring layer formed by a lithographic technique. Each of thin-film wiring patterns 40 shown in the drawing is formed on the multilayer ceramic board 21a to electrically connect bumps 41 to vias 42 at the surface of the multilayer ceramic board 21a. Each of the thin-film wiring patterns 40 has a region (via contact region 43) occupying a comparatively large area for direct contact with the electric connecting point appearing at the surface of the multilayer ceramic board, a region (bump contact region 44 serving as a probe contact region) occupying a comparatively small area, and a lead region 45 for providing a connection between the via contact region 43 and the bump contact region 44. As will be understood from the drawing, the arrangement pitch for the via contact regions 43 is higher than the arrangement pitch for the bump contact regions 44. The arrangement pitch of the bump contact regions 44 is equal to the arrangement pitch P of the bumps 41. In the layout, the arrangement pitch of the bumps 41 and the length L of the side of the square portion (via contact region 43) of each of the thin-film wiring patterns 40 are set to 200 μm and 300 μm, respectively.

Figure 4B:
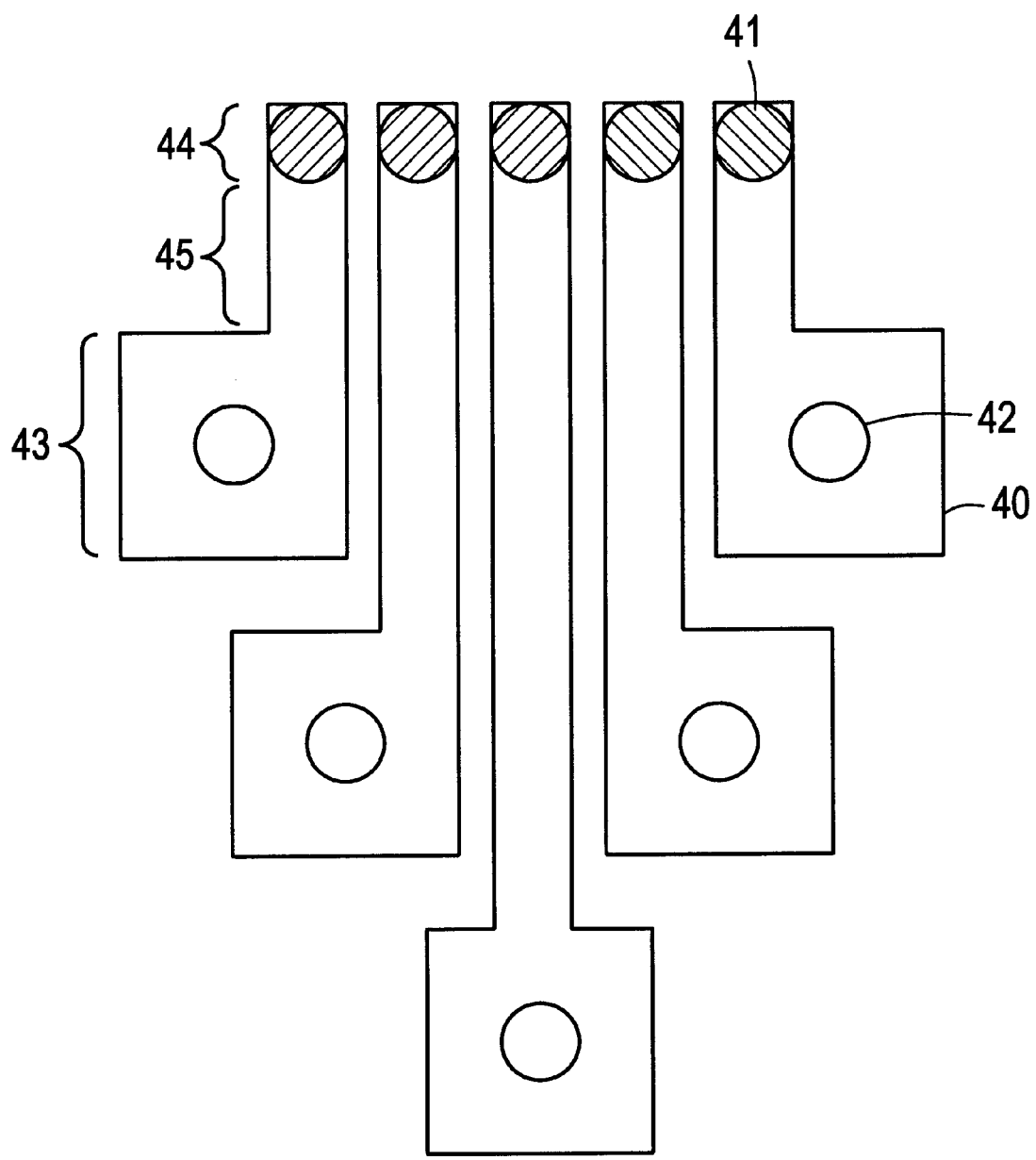

Since the thin-film wiring patterns 40 are formed by a lithographic technique as described above, they can be formed at predetermined positions with high accuracy based on the layout shown in FIGS. 4A and 4B. On the other hand, the vias 42 at the surface of the multilayer ceramic board 21a may be displaced greatly to the positions diagrammatically shown by the dashed circles in FIG. 4A. However, since the thin-film wiring patterns 40 are formed with high accuracy to be sufficiently large for ensured contacts with the greatly displaced vias 42 on the surface of the multilayer ceramic board 21a, the bumps 41 are easily allotted to the bump contact regions. Thus, the bumps 41 are surely connected to the vias 42 on the surface of the multilayer ceramic board 21a by interposing the thin-film wiring patterns 40 therebetween. As will be appreciated from the layout, the regions of the thin-film wiring patterns 40 for contact with the vias (via contact regions 43) are arranged in at least two rows. This enables the via contact regions to be arranged with a pitch higher than the arrangement pitch P for the bumps 41. However, the via contact regions 43 can be arranged in one row.

FIG. 4B shows another exemplary layout of the patterned thin-film wiring layer formed with high accuracy by the thin-film formation process using a lithographic technique. In the layout shown in FIG. 4B, the portions (via contact regions 43) of the thin-film wiring patterns 40 for contact with the vias are arranged in three rows.

Referring to FIGS. 5A to 5D, a method of fabricating the multilayer ceramic board according to the present invention will be described.

Figure 5A:
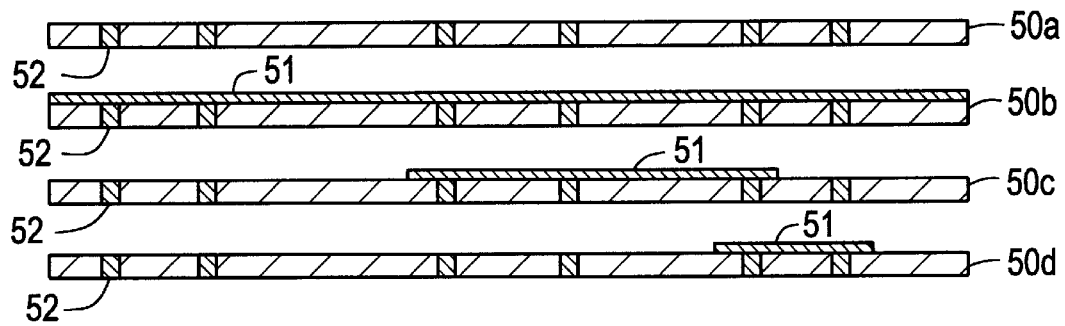
FIGS. 5A to 5D are cross-sectional views for illustrating the process of fabricating a multilayer ceramic board according to an embodiment of the present invention.

First, as shown in FIG. 5A, four green sheets 50a, 50b, 50c, and 50d each having a thickness ranging from 100 μm to 200 μm are prepared. If each of the green sheets has a comparatively small thickness, a plurality of dummy layers (green sheets having only vias with no wiring) may be laminated and interposed between the adjacent green sheets, thereby adjusting the spacing between the upper and lower wiring layers to a desired magnitude. The via holes are formed in the specified portions of the green sheets 50a to 50d and a wiring layer 51 is formed on one side (or either side) of each of the green sheets 50a and 50d by a sputtering or like process. The wiring layer 51 is preferably composed of a material such as tungsten (W) or molybdenum (Mo). On the other hand, via-hole wiring 52 is formed in the via holes. The wiring layer 51 is to constitute the multilayer wiring layers 21b.

Next, the green sheets 50a to 50d are layered and heated under pressure (sintering process). The sintering process, composed of pre-sintering and main sintering, is performed at a temperature in the range of, e.g., 1500 to 1600° C. for about 24 hours. As a result of laminating the green sheets 50a to 50d, the wiring layer 51 on each level is connected to the wiring layers 51 on the other levels through the via-hole wiring 52. It will be appreciated that the number of layered green sheets and the thickness of each green sheet are not limited to the foregoing.

Figure 5B:
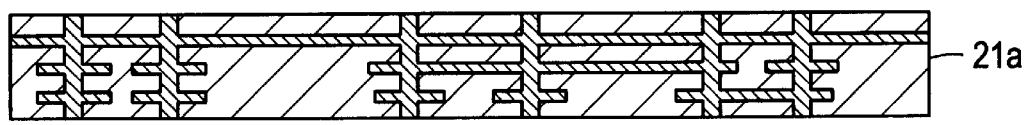

Thus, there can be formed the multilayer ceramic board 21a containing the plurality of wiring layers shown in FIG. 5B. The respective ends of the numerous vias (via-hole wiring 52) are exposed at the top and back surfaces of the obtained multilayer ceramic board 21a. As described above with reference to FIG. 4, the vias on the top surface of the board and the thin-film wiring layer are electrically connected to each other. The actual multilayer ceramic board 21a has contracted vertically and horizontally as a result of the sintering process, though the drawing thereof is omitted in FIG. 5B. Consequently, the positions of the via holes and the distances therebetween are varied from the positions and distances on the green sheets.

If the degree of planarization of the surface of the multilayer ceramic board 21a is to be improved, the surface of the multilayer ceramic board 21a is planerized by chemical mechanical polishing (CMP). To provide ensured contacts between the numerous electrodes on the large wafer and the probe electrodes of the probe card, the degree of planarization of the multilayer ceramic board 21a is preferably maximized. As a ceramic material, a material having a thermal expansion coefficient close to that of Si such as Mullite-based material, SiN, SiC, or alumina is preferred.

Figure 5C:
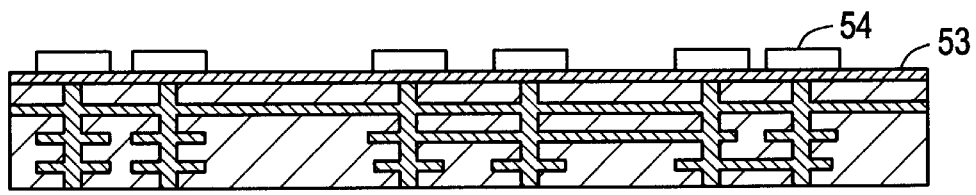
Figure 5D:
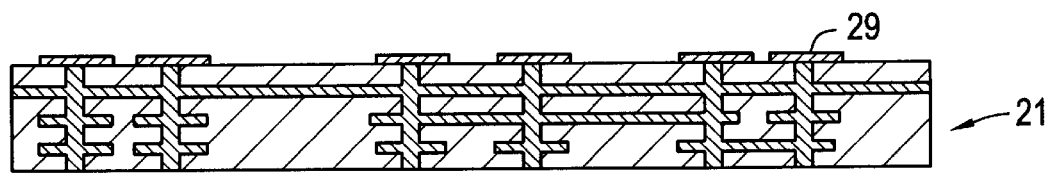

Next, as shown in FIG. 5C, a conductive thin film 53 is deposited on the surface of the multilayer ceramic board by using a thin-film deposition method such as sputtering. As the material of the conductive thin film 53, copper or aluminum is used adequately. Preferably, the conductive thin film 53 has a thickness of about 1 to 10 μm.

Finally, the conductive thin film 53 is patterned into a desired configuration by a lithographic technique, whereby a thin-film wiring layer having a two-dimensional layout as shown in, e.g., FIG. 4A is formed. More specifically, a resist pattern 54 is formed on the conductive thin film 53 through the step of forming a photoresist layer on the conductive tin film 53, an exposure step using a photomask, and a development step (see FIG. 5C). The resist pattern 54 is for defining the pattern of the thin-film wiring layer 29 to be formed. Although the present embodiment has performed the foregoing steps by using a lithographic technique, another lithographic technique involving the use of an X-ray or an electron beam may also be used in the future.

Thereafter, the portions of the conductive thin film 53 uncovered with the resist pattern 54 are removed by an etching process such as dry etching. What results is the multilayer ceramic board 21 shown in FIG. 5D.

In patterning the conductive thin film 53, alignment is performed at the lithographic stage to establish a precisely overlapping relationship between the via-hole wiring 52 exposed at the surface of the multilayer ceramic board 21a and the thin-film wiring layer 29 to be formed. As stated previously, the thin-film wiring layer 29 functions satisfactorily as the pad for contact with a bump which compensates for the displacement between the bump and the corresponding via.

After the thin-film-wiring-layer 29 is formed, the surface of the multilayer ceramic board 21a may be covered with a protective film (not shown). In that case, the protective film is patterned to expose the portions of the thin-film wiring layer 29 to be connected to the bumps.

Figure 6:
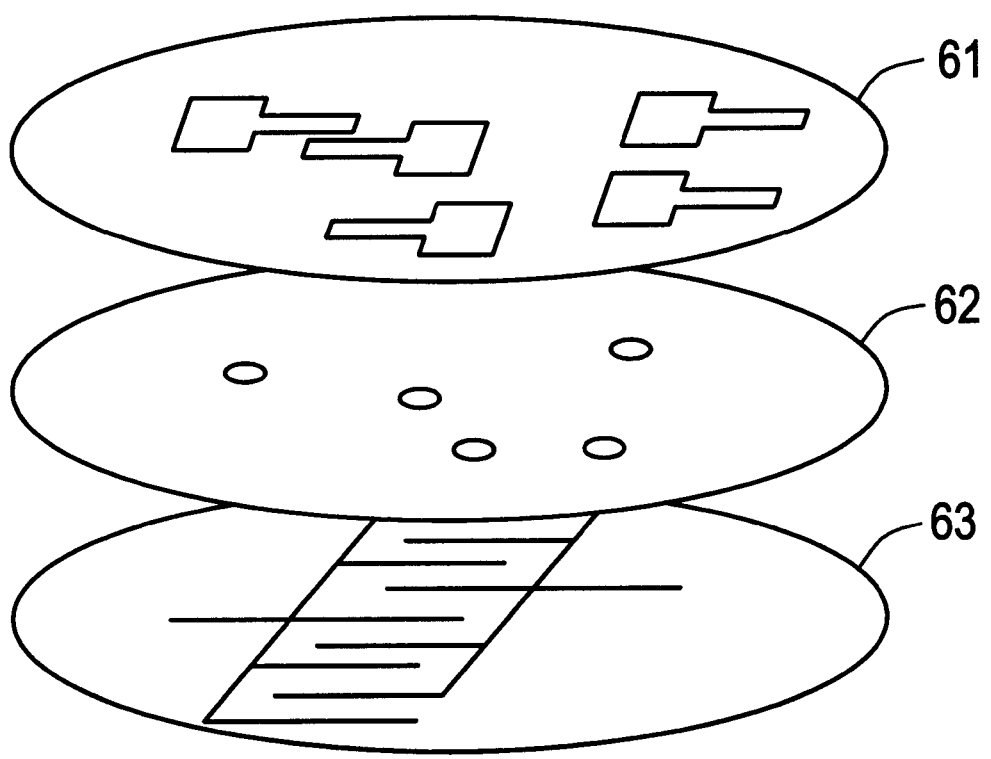
FIG. 6 is a perspective view of a multilayer wiring board according to the embodiment of the present invention.

FIG. 6 is a perspective view diagrammatically showing a pattern on the thin-film wiring level 61, a pattern on the surface level 62 of the multilayer ceramic board, and a wiring pattern on the lower level 63. Although the surface level 62 of the ceramic board is constituted by the green sheets having the via-hole wiring in the present embodiment, the level 62 may be formed by the thin-film process. In that case, an interlevel dielectric film between the levels 61 and 63 is thinner than each of the green sheets but presents no problem unless the high-frequency characteristics are seriously affected thereby.

It is to be noted that the number of thin-film wiring layers (the number of levels) formed by the foregoing thin-film process is not limited to one. It is also possible to form two or more thin-film wiring layers 29 with interventions of an interlevel dielectric film formed by using a thin-film depositing technique. Another thin-film wiring layer may also be formed on the back surface of the multilayer ceramic board 21a.

Thus, the probe card according to the present embodiment using the multilayer ceramic wiring board facilitates the effective use of the surface of the probe card formed with no bumps, i.e., the back surface thereof. This is because through-hole wiring extending through the board can be formed easily in the multilayer ceramic wiring board. It is also possible to mount a driver IC for driving a circuit element to be tested on the back surface of the probe card. In the case of connecting the probe card to a testing or measurement device such as a burn-in system, an electric connection is easily established if electric connecting means such as a connector is disposed on the back surface of the probe card. Moreover, since an electric signal can be transmitted from an external device to a circuit on the wafer over a minimum distance, such a problem as a rounded signal waveform or an overshoot can be obviated, while the high-frequency characteristics are further improved. Thus, the use of the multilayer ceramic board in the probe card achieves various effects.

Although the localized anisotropic conductive rubber 23 is used to provide electric connections between the thin-film wiring layer on the multilayer ceramic board and the bumps in the embodiment shown in FIG. 2, the thin-film wiring layer may also be in direct contact with the bumps without using the localized anisotropic conductive rubber 23. Conversely, if the bumps are formed on the wafer as the target of measurement, it is no more necessary to form the bumps in the probe card. In that case, if the tip portion of the localized anisotropic conductive rubber 23 of the probe card is pressed against the bumps on the wafer, a wafer-level measurement can be performed. The thin-film wiring layer of the multilayer wiring board may also be in direct contact with the bumps on the wafer without using the localized anisotropic conductive rubber 23.

The foregoing multilayer ceramic board may be used in a board other than the multilayer wiring board for use in the probe card for wafer-level measurement. For example, the multilayer ceramic board can also be used in a board for a multichip module (MCM).

In the probe card according to the present invention, the multilayer wiring board to be electrically connected to the plurality of probe electrodes arranged in two dimensions is formed of the multilayer ceramic board and the thin-film wiring layer is formed by a lithographic technique on the multilayer ceramic board. As a result, the high-frequency characteristics of multilayer wiring are remarkably improved, while ensured electric connections are provided between the probe electrodes arranged with an extremely low pitch and the multilayer wiring.

When the probe electrodes are bump electrodes, the probe electrodes are easily brought into positive contact with the electrodes on the wafer. Moreover, it is no more necessary to form the bump electrodes on the wafer.

When a conductive rubber for electrically connecting the probe electrodes to the wiring on the multilayer wiring board is provided between the probe electrodes and the multilayer wiring board, the elasticity of the conductive rubber compensates for a level difference observed at the top surface of the wafer, so that ensured contact is achieved over the entire surface of the wafer.

When the probe electrodes are formed on a thin film stretched under tension on the rigid ring, bump displacement due to the different thermal expansion coefficients of the wafer and the thin film is prevented during a measurement performed at a higher-than-ordinary temperature. This achieves an ensured contact between the probe card and the wafer at a temperature different from ordinary temperature.

Each of the probe electrodes may be formed of a part of the wiring layer on the multilayer wiring board. In the case where the bump electrodes are formed on the wafer, there is little necessity for providing the bump electrodes in the probe card so that the electrodes on the multilayer wiring board are used adequately as the probe electrodes without any alterations, which results in a simple structure.

When at least one surface of the multilayer ceramic board is planarized by a polishing process, the distance from the surface of the wafer as the target of measurement can be held substantially uniform over the entire planarized surface of the multilayer ceramic board, so that ensured contacts are provided between the probe electrodes and the electrodes on the wafer.

In the multilayer ceramic board, if the probe electrodes are connectable to an external circuit via the through-hole wiring, the numerous probe electrodes are easily connected to the external circuit.

Since the multilayer ceramic wiring board according to the present invention has at least one thin-film wiring layer formed on at least one surface of the multilayer ceramic board, the problem of displacement induced by the contraction of the ceramic board does not occur and the multilayer wiring can be connected with high accuracy to various electronic elements. Thus, there can be implemented a multilayer wiring board suitable for carrying an electronic element having electrodes arranged with a low pitch and excellent in high-frequency characteristics.

Since the method of fabricating the multilayer ceramic wiring board according to the present invention comprises the steps of forming the multilayer ceramic board and forming at least one thin-film wiring layer on at least one surface of the multilayer ceramic board after the sintering process, even when the multilayer ceramic board contracts during the fabricating process, the thin-film wiring layer formed with high accuracy solves the problem of displacement induced by contraction.

In the case of disposing an electronic device such as an IC chip on the multilayer ceramic board, when at least one surface of the multilayer ceramic board is planarized by polishing prior to the formation of the thin-film wiring layer, easier contact is provided between the element and the thin-film wiring layer.

Since the method of fabricating the probe card according to the present invention comprises the steps of forming the multilayer ceramic board, forming at least one thin-film wiring layer on at least one surface of the multilayer ceramic board by a lithographic technique to form the multilayer wiring board therefrom, and disposing the plurality of bump electrodes functioning as the probe electrodes such that the bump electrodes are in electric contact with the thin-film wiring layer, there can be implemented a probe card with excellent high-frequency characteristics.

What is claimed is:

1. A probe card for wafer-level measurement comprising:

a multilayer ceramic board comprising a plurality of insulating films and a plurality of thin-film wiring layers each of which is formed between two of the plurality of insulating films and is electrically connected to another one of the plurality of thin-film wiring layers through a first via formed within the plurality of insulating films, the multilayer ceramic board having been sintered;

a thin-film wiring layer pattern formed on a surface of the multilayer ceramic board; and a polyimide film having a plurality of probe terminals formed on a surface thereof, wherein the thin-film wiring layer pattern comprises:
via contact regions connected to one of the plurality of thin-film wiring layers through second vias, respectively;
probe contact regions connected to the plurality of probe terminals, respectively, and
lead regions connecting the via contact regions and the probe contact regions, respectively,
a pitch of the via contact regions being greater than that of the probe contact regions.

2. The probe card according to claim 1, wherein the probe contact regions and the via contact regions are arranged in rows, respectively, such that each of the probe contact regions arranged in one row is connected through the lead region to any one of the via contact regions arranged in two or more rows.

3. The probe card according to claim 1, wherein an area of each of the via contact regions is larger than an area of each of the probe contact regions.

4. The probe card according to claim 1 wherein each of the probe terminals is a bump.

* * * * *